United States Patent
Nakano et al.

(10) Patent No.: US 9,324,879 B2
(45) Date of Patent: *Apr. 26, 2016

(54) THIN FILM TRANSISTOR, METHOD FOR MANUFACTURING SAME, AND DISPLAY DEVICE

(71) Applicant: Kabushiki Kaisha Toshiba, Minato-ku (JP)

(72) Inventors: Shintaro Nakano, Kanagawa-ken (JP); Tomomasa Ueda, Kanagawa-ken (JP); Kentaro Miura, Kanagawa-ken (JP); Nobuyoshi Saito, Kanagawa-ken (JP); Tatsunori Sakano, Tokyo (JP); Hajime Yamaguchi, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/837,066

(22) Filed: Aug. 27, 2015

(65) Prior Publication Data

US 2015/0372147 A1   Dec. 24, 2015

Related U.S. Application Data

(63) Continuation of application No. 13/483,593, filed on May 30, 2012, now Pat. No. 9,159,836.

(30) Foreign Application Priority Data

Sep. 27, 2011   (JP) .................... 2011-211657

(51) Int. Cl.
*H01L 29/12* (2006.01)
*H01L 29/786* (2006.01)
(Continued)

(52) U.S. Cl.
CPC ...... *H01L 29/7869* (2013.01); *H01L 21/02266* (2013.01); *H01L 21/02565* (2013.01);
(Continued)

(58) Field of Classification Search
CPC .................................. H01L 27/3262
USPC ............................ 257/43, 57, 649
See application file for complete search history.

(56) References Cited

U.S. PATENT DOCUMENTS

| | | |
|---|---|---|
| 2005/0039670 A1 | 2/2005 | Hosono et al. |
| 2007/0029626 A1 | 2/2007 | Sakama et al. |
| 2010/0133525 A1 | 6/2010 | Arai et al. |

FOREIGN PATENT DOCUMENTS

| | | |
|---|---|---|
| CN | 1881596 A | 12/2006 |
| CN | 102084486 A | 6/2011 |

(Continued)

OTHER PUBLICATIONS

U.S. Appl. No. 13/483,593, Nakano et al., May 30, 2012.*
(Continued)

*Primary Examiner* — Samuel Gebremariam
(74) *Attorney, Agent, or Firm* — Oblon, McClelland, Maier & Neustadt, L.L.P.

(57) ABSTRACT

According to one embodiment, a thin film transistor includes a substrate, a gate electrode, a first insulating film, an oxide semiconductor film, a second insulating film, a source electrode, and a drain electrode. The gate electrode is provided on a part of the substrate. The first insulating film covers the gate electrode. The oxide semiconductor film is provided on the gate electrode via the first insulating film. The second insulating film is provided on a part of the oxide semiconductor film. The source and drain electrodes are respectively connected to first and second portions of the oxide semiconductor film not covered with the second insulating film. The oxide semiconductor film includes an oxide semiconductor. Concentrations of hydrogen contained in the first and second insulating films are not less than $5 \times 10^{20}$ atm/cm$^3$, and not more than $10^{19}$ atm/cm$^3$, respectively.

13 Claims, 8 Drawing Sheets

(51) Int. Cl.
  *H01L 29/24*      (2006.01)
  *H01L 29/423*     (2006.01)
  *H01L 27/32*      (2006.01)
  *H01L 51/00*      (2006.01)
  *H01L 29/66*      (2006.01)
  *H01L 21/02*      (2006.01)

(52) U.S. Cl.
  CPC ............ *H01L27/3244* (2013.01); *H01L 29/24* (2013.01); *H01L 29/42364* (2013.01); *H01L 29/42384* (2013.01); *H01L 29/66969* (2013.01); *H01L 29/78603* (2013.01); *H01L 51/0096* (2013.01); *H01L 2251/5338* (2013.01)

(56) References Cited

FOREIGN PATENT DOCUMENTS

| JP | 2004-103957 | 4/2004 |
| JP | 2008-227406 | 9/2008 |
| JP | 2010-135462 | 6/2010 |
| JP | 2011-142309 | 7/2011 |
| WO | WO 2010/074927 A2 | 7/2010 |
| WO | WO 2010/074927 A3 | 7/2010 |

OTHER PUBLICATIONS

Nobuyoshi Saito, et al., "Amorphous In—Ga—Zn—Oxide TFTs with High Stability against Bias Temperature Stress", International Display Workshop '10 Digest, 4 pages.

Office Action issued Jun. 26, 2013 in Korean Patent Application No. 10-2012-0057530 (w/English-language translation).

Chinese Office Action issued Nov. 3, 2014 in China Patent Application No. 201210177380.7 (w/English translation).

Office Action issued on Jan. 9, 2015 in Japanese Patent Application No. 2011-211657 (w/English translation).

\* cited by examiner

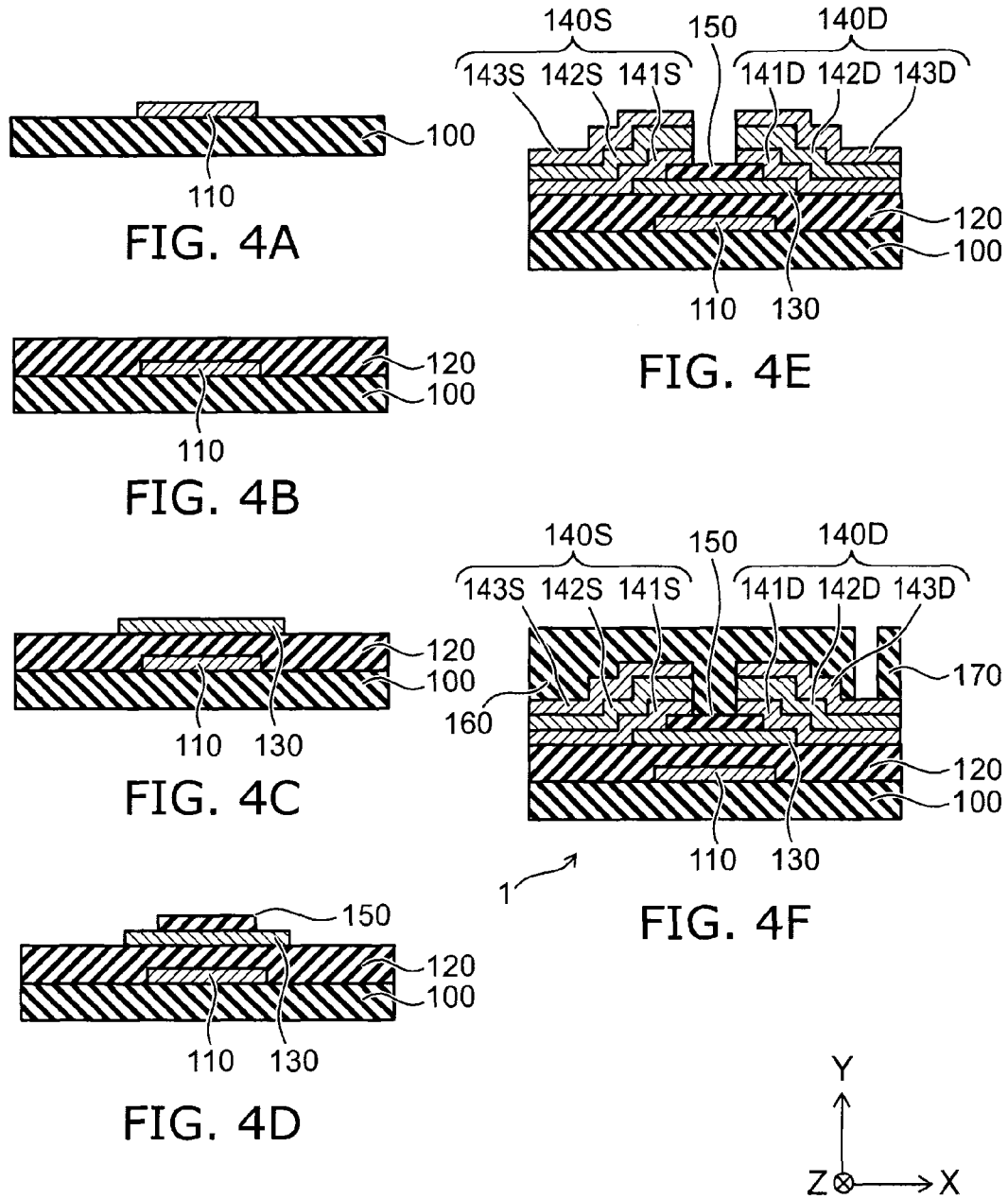

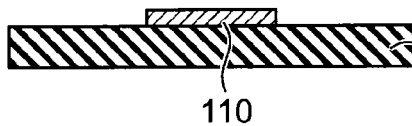
FIG. 6A
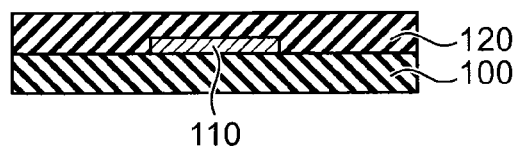
FIG. 6B
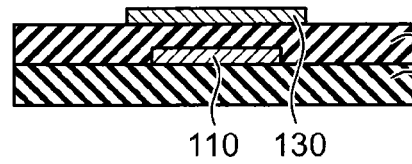
FIG. 6C
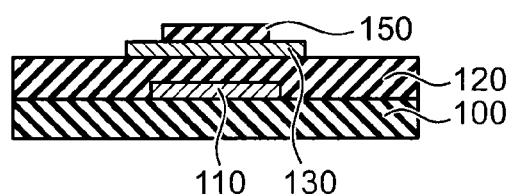
FIG. 6D
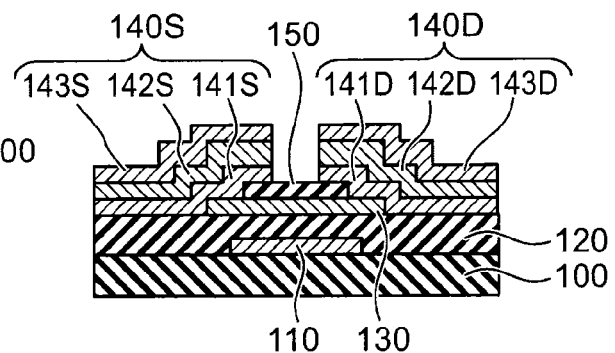
FIG. 6E
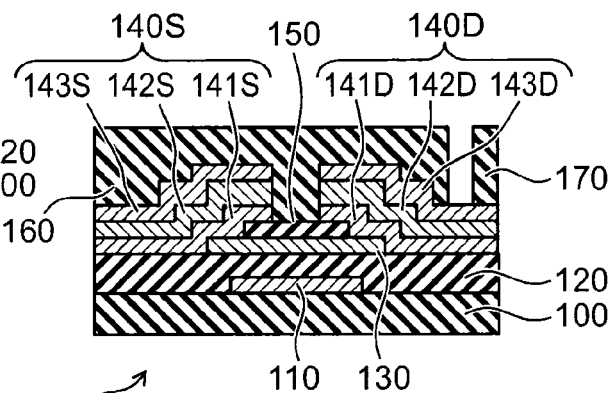
FIG. 6F
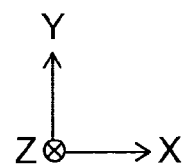

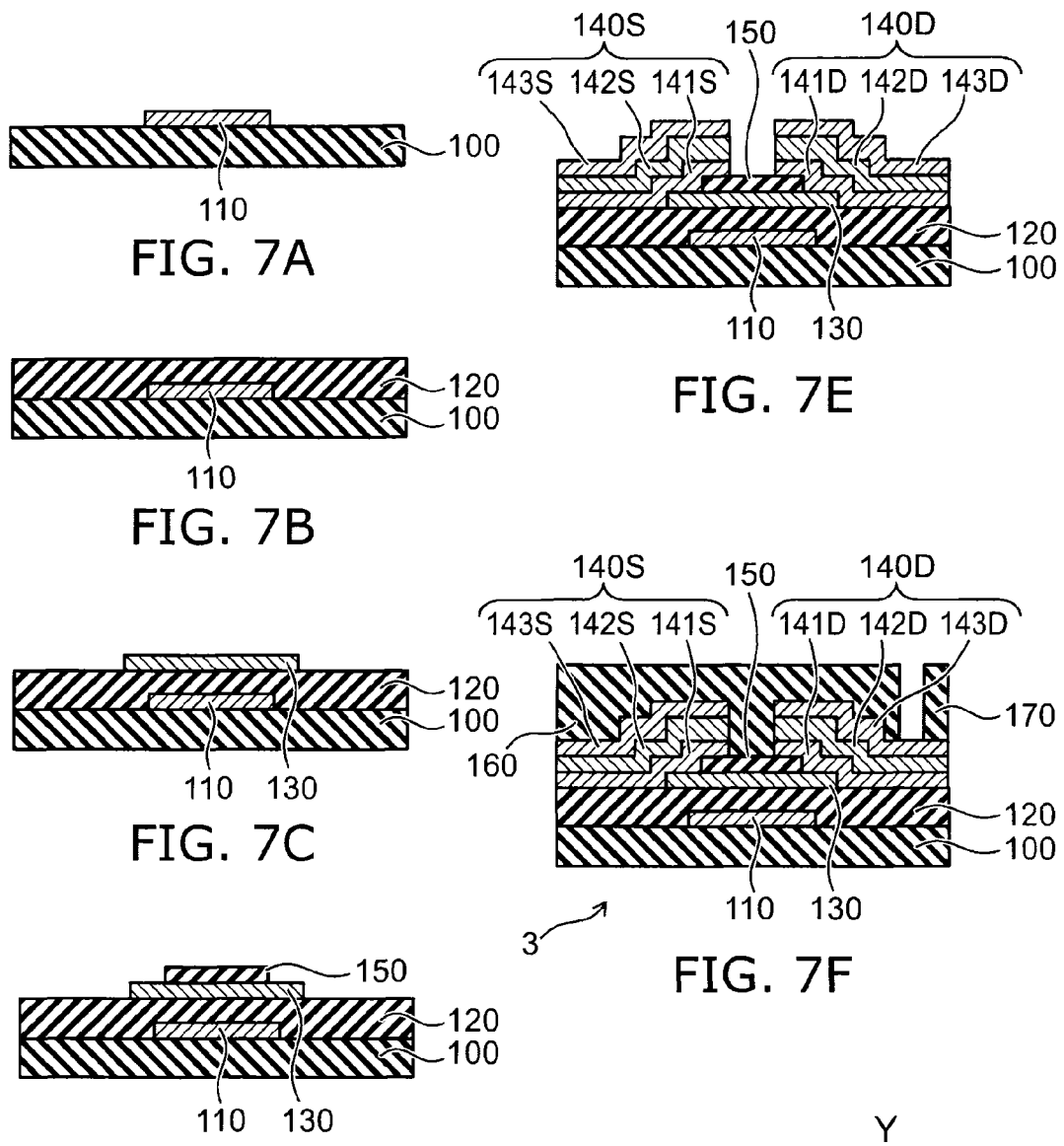

THIN FILM TRANSISTOR, METHOD FOR MANUFACTURING SAME, AND DISPLAY DEVICE

CROSS-REFERENCE TO RELATED APPLICATIONS

This application is a continuation of and claims the benefit of priority under 35 U.S.C. §120 from U.S. Ser. No. 13/483,593 filed May 30, 2012, and claims the benefit of priority under 35 U.S.C. §120 from Japanese Patent Application No. 2011-211657 filed Sep. 27, 2011; the entire contents of each of which are incorporated herein by reference.

FIELD

Embodiments described herein relate generally to a thin film transistor, a method for manufacturing the same and a display device.

BACKGROUND

A TFT (Thin Film Transistor) has been widely used for liquid crystal display devices, organic EL (Electro Luminescence) display devices, etc.

Although an amorphous silicon TFT used for large liquid crystal displays has a problem in reliability of prolonged drive because a field effect mobility (mobility) thereof is approximately 1 $cm^2/V \cdot s$, the TFT can be formed over a large area, at low cost, and uniformly because it can be formed with plasma CVD (Chemical Vapor Deposition) suitable for film formation over the large area.

In addition, although a low temperature polysilicon TFT used for small and medium-sized liquid crystal displays has a problem in cost reduction and uniformity, the TFT has high reliability of prolonged drive because a mobility thereof is approximately 100 $cm^2/V \cdot s$.

In recent years, further increase in size, high definition, and cost reduction of display devices have been desired. In addition to that, an active-matrix type organic EL display device utilizing current drive has been studied and developed at home and abroad, and a new semiconductor material has been desired which can be formed at low cost and which has high uniformity, high reliability, and a high mobility.

Consequently, in recent years, an oxide semiconductor has been attracting attention as a semiconductor film material of a TFT. In particular, a TFT using an amorphous oxide semiconductor, such as IGZO (In—Ga—Zn—O) has been attracting attention. Since a film of the oxide semiconductor can be uniformly formed over a large area at room temperature by a sputtering method and is transparent in a visible light region, it is possible to form a flexible and transparent TFT even on a plastic film substrate with low heat resistance.

Further, since the oxide semiconductor has a mobility approximately ten times higher than amorphous silicon, a high mobility characteristic can be obtained by using the oxide semiconductor. In addition, high reliability can be obtained with respect to a BTS (Bias Temperature Stress) test by applying post-annealing to the oxide semiconductor with a high temperature of 300 to 400° C. Such features have made the oxide semiconductor a front-runner as a semiconductor material used for a next-generation back plane device of a display device.

BRIEF DESCRIPTION OF THE DRAWINGS

FIG. 4A to FIG. 4F are cross-sectional schematic views showing a method for manufacturing the thin film transistor according to the first embodiment;

FIG. 6A to FIG. 6F are cross-sectional schematic views showing a method for manufacturing a thin film transistor according to a second embodiment;

FIG. 7A to FIG. 7F are cross-sectional schematic views showing a method for manufacturing a thin film transistor according to a third embodiment;

DETAILED DESCRIPTION

Figure 1A:
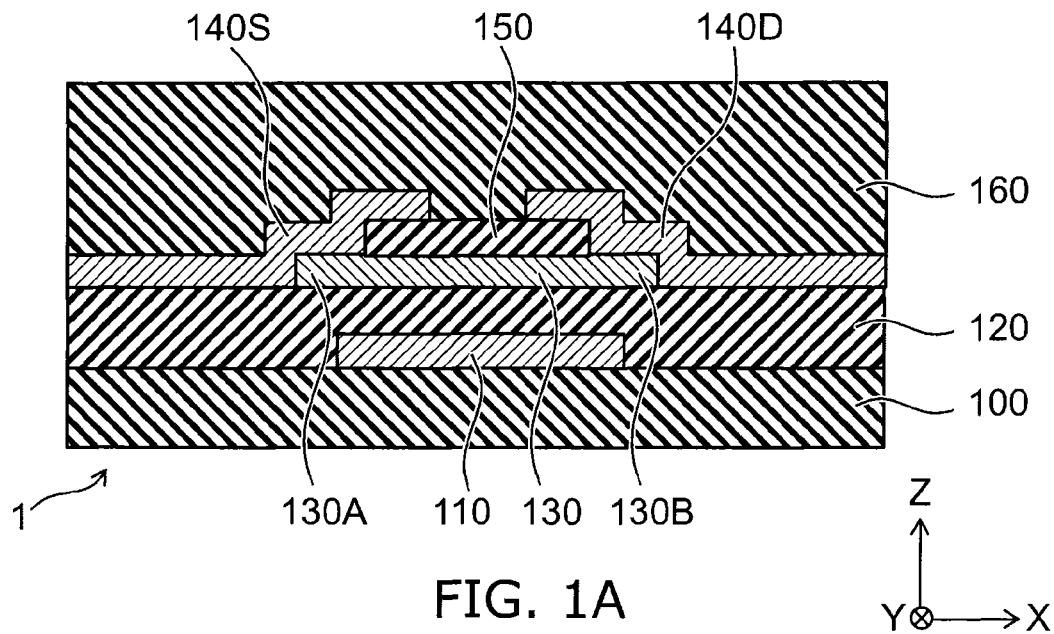
FIG. 1A and FIG. 1B are a cross-sectional schematic view and a top schematic view showing a thin film transistor according to a first embodiment.

According to one embodiment, a thin film transistor includes a substrate, a gate electrode, a first insulating film, an oxide semiconductor film, a second insulating film, a source electrode, and a drain electrode. The gate electrode is provided on a part of the substrate. The first insulating film covers the gate electrode. The oxide semiconductor film is provided on the gate electrode via the first insulating film. The second insulating film is provided on a part of the oxide semiconductor film. The source electrode is connected to a first portion of the oxide semiconductor film. The first portion is not covered with the second insulating film. The drain electrode is connected to a second portion of the oxide semiconductor film. The second portion is not covered with the second insulating film. The oxide semiconductor film includes an oxide semiconductor including at least one element of In, Ga, and Zn.

A concentration of hydrogen contained in the first insulating film is not less than $5 \times 10^{20}$ $atm/cm^3$ ($atoms/cm^3$), and a concentration of hydrogen contained in the second insulating film is not more than $10^{19}$ $atm/cm^3$.

According to one embodiment, a display device includes a thin film transistor, a first electrode, a second electrode and a display layer. The thin film transistor includes a substrate, a gate electrode, a first insulating film, an oxide semiconductor film, a second insulating film, a source electrode, and a drain electrode. The gate electrode is provided on a part of the substrate. The first insulating film covers the gate electrode. The oxide semiconductor film is provided on the gate electrode via the first insulating film. The second insulating film is provided on a part of the oxide semiconductor film. The source electrode is connected to a first portion of the oxide semiconductor film. The first portion is not covered with the second insulating film. The drain electrode is connected to a second portion of the oxide semiconductor film. The second portion is not covered with the second insulating film. The oxide semiconductor film includes an oxide semiconductor including at least one element of In, Ga, and Zn. A concentration of hydrogen contained in the first insulating film is not less than $5 \times 10^{20}$ $atm/cm^3$, and a concentration of hydrogen contained in the second insulating film is not more than $10^{19}$ $atm/cm^3$. The first electrode is connected to the source electrode or the drain electrode of the thin film transistor. The second electrode faces the first electrode. The display layer is provided between the first electrode and the second electrode.

According to one embodiment, a method is disclosed for manufacturing a thin film transistor. The method can include forming a gate electrode on a part of a substrate. The method can include forming a first insulating film covering the gate electrode and containing a concentration of hydrogen not less than $5 \times 10^{20}$ atm/cm$^3$. The method can include forming an oxide semiconductor film on the first insulating film by using an oxide semiconductor including at least one element of In, Ga, and Zn so as to face the gate electrode. The method can include forming a second insulating film on a part of the oxide semiconductor film, the second insulating film containing a concentration of hydrogen not more than $10^{19}$ atm/cm$^3$. In addition, the method can include forming a source electrode and a drain electrode. The source electrode is connected to a first portion of the oxide semiconductor film. The first portion is not covered with the second insulating film. The drain electrode is connected to a second portion of the oxide semiconductor film. The second electrode is not covered with the second insulating.

When a thin film transistor array is formed on an insulating substrate with low heat resistance as a plastic substrate, a thin film transistor is formed in a low temperature process. Although a thin film transistor formed in a low temperature process not more than 300° C. can obtain an initial characteristic equal to a thin film transistor formed in a high temperature process not less than 300° C., there has been a case where it cannot obtain high reliability.

Embodiments provide a thin film transistor with high reliability that is formed in a low temperature process, a method for manufacturing the thin film transistor, and a display device.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 1B:
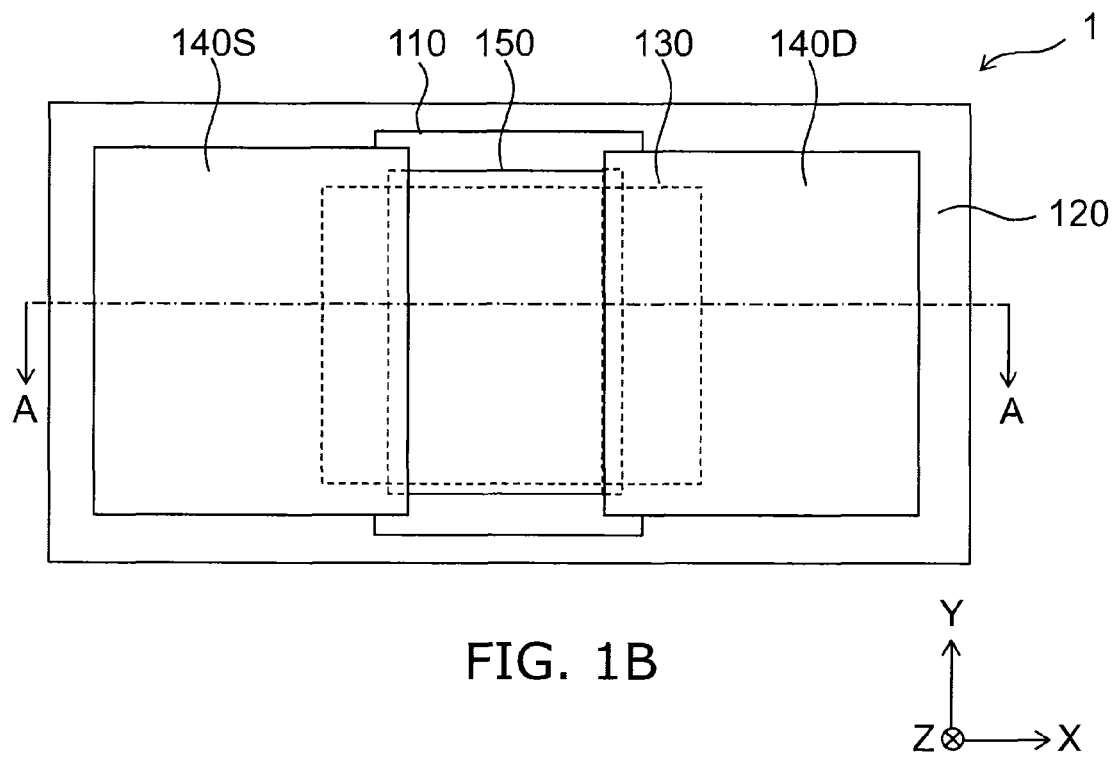

FIG. 1A is a cross-sectional schematic view showing a structure of a thin film transistor 1 according to a first embodiment. FIG. 1B is a plan schematic view showing the structure of the thin film transistor 1 according to the first embodiment. FIG. 1A shows a cross section taken along a line A-A of FIG. 1B.

The thin film transistor 1 according to the first embodiment comprises: a substrate 100; a gate electrode 110 provided on a part of one major surface of the substrate 100; a gate insulating film 120 (first insulating film) that covers the gate electrode 110; an oxide semiconductor film 130 provided on the gate electrode 110 through the gate insulating film 120; a channel protection film 150 (second insulating film) provided on a part of the oxide semiconductor film 130; and a source electrode 140S and a drain electrode 140D that are connected to a part of the oxide semiconductor film 130 exposed from the channel protection film 150. The source electrode 140S is connected to a first portion 130A of the oxide semiconductor film 130 not covered with the second insulating film (channel protection film 150). The drain electrode 140D is connected to a second portion 130B of the oxide semiconductor film 130 not covered with the second insulating film (channel protection film 150). The thin film transistor 1 is covered with a sealing layer 160. The sealing layer 160 is omitted in FIG. 1B.

As shown in FIG. 1B, when the thin film transistor 1 is observed from a top face, the source electrode 140S and the drain electrode 140D face each other through the channel protection film 150. Namely, a Z direction is a direction perpendicular to the one major surface of the substrate 100. In addition, the channel protection film 150 covers an end of the oxide semiconductor film 130 located between the source electrode 140S and the drain electrode 140D.

A direction in which the substrate 100, the gate electrode 110, the gate insulating film 120, the oxide semiconductor film 130, and the channel protection film 150 are stacked is defined as the Z direction. In addition, one direction parallel to the major surface of the substrate 100 is defined as an X direction, and a direction perpendicular to the X direction and the Z direction is defined as a Y direction. It is defined that the source electrode 140S and the drain electrode 140D are disposed facing each other in the X direction.

When viewed in the direction (Z direction) toward the first insulating film from the gate electrode 110, at least a part of the gate electrode 110 is disposed between the source electrode 140S and the drain electrode 140D.

In a face parallel to the one major surface of the substrate 100, a direction with a longer width along a side of the gate electrode 110 is defined as a longitudinal direction of the gate electrode 110. The longitudinal direction of the gate electrode 110 corresponds to the Y direction in FIG. 1B. A longitudinal direction of the oxide semiconductor film 130 is orthogonal to the longitudinal direction of the lower layer gate electrode 110. Namely, the longitudinal direction of the oxide semiconductor film 130 is the X direction. The channel protection film 150 covers an end side along the longitudinal direction of the oxide semiconductor film 130.

As the substrate 100, for example, a light-transmissive glass substrate, a plastic substrate, a non-translucent silicon substrate, and a stainless steel substrate can be used. Alternatively, a flexible or plastic substrate can be used as the substrate 100. For example, the film-like flexible substrate 100 can be used. The substrate 100 may have an insulating layer on one major surface on which the gate electrode 110 is formed. Namely, the one major surface of the substrate 100 on which the gate electrode 110 is formed is only necessary to have an insulating property. When a flexible display device is formed, for example, a film-like substrate made of a resin material can be used.

Various types of conductive materials can be used for the gate electrode 110. For example, high melting point metal, such as MoW (Molybdenum tungsten), MoTa (molybdenum tantalum), and W (tungsten) can be used. In addition to the above, Al (aluminum)-based Al alloy taken measures for a hillock may be used, and a stacked film of Al and high melting point metal may be used.

$SiO_2$ (silicon dioxide), $SiO_xN_y$ (silicon oxynitride:H), $SiN_x$ (silicon nitride:H), etc. can be used for the gate insulating film 120. Furthermore, a stacked film of the above described materials may be used.

The oxide semiconductor film 130 has an oxide containing at least one element of indium (In), gallium (Ga), and zinc (Zn), and, for example, it is formed of an amorphous oxide semiconductor, such as In—Ga—Zn—O (indium gallium zinc oxide, and hereinafter referred to as IGZO). Since a diffraction pattern indicating crystallinity, etc. is not observed even though the oxide semiconductor film 130 is observed by a transmission electron microscope (TEM) or X-ray diffraction (XRD), it can be found out that the oxide semiconductor film 130 is in an amorphous state.

A film thickness of the oxide semiconductor film 130 may be approximately not less than 5 nm in order to secure an electrical characteristic and specifically, can be set to be approximately not less than 5 and not more than 50 nm. A film quality and a shape of the oxide semiconductor film 130 can be observed by a scanning electron microscope (SEM), a transmission electron microscope (TEM), etc.

An insulating material can be used for the channel protection film 150 and, for example, a silicon oxidation film with acid resistance higher than a material of the oxide semiconductor film 130 is used.

An insulating material can be used for the sealing layer 160 and, for example, a silicon oxidation film, a silicon nitride film, or a stacked film thereof can be used. In addition to the above, alumina and tantalum oxide with a high hydrogen barrier property can be used.

A conductive material can be used for the source electrode 140S and the drain electrode 140D. For example, a stacked film of Ti (titanium)/Al (aluminum)/Ti (titanium) and Mo (molybdenum)/Al (aluminum)/Mo (molybdenum), or indium tin oxide (ITO), etc. can be used. Alternatively, by applying Ar (argon) plasma treatment to a part of the oxide semiconductor film 130 that is not covered with the channel protection film 150, resistance of the part can also be reduced to make the part serve as the source electrode 140S and the drain electrode 140D.

A concentration of hydrogen contained in the gate insulating film 120 of the thin film transistor 1 is not less than $5 \times 10^{20}$ atm/cm$^3$, and a concentration of hydrogen contained in the channel protection film 150 is not more than $10^{19}$ atm/cm$^3$.

Dangling bond of a material molecule of the oxide semiconductor film 130 and the gate insulating film 120 can be hydrogen-terminated in an interface of the oxide semiconductor film 130 and the gate insulating film 120 by setting a hydrogen concentration in the gate insulating film 120 to be not less than $5 \times 10^{20}$ atm/cm$^3$. Furthermore, since hydrogen in the gate insulating film 120 diffuses to the oxide semiconductor film 130, a defect within the oxide semiconductor film 130 can be hydrogen-terminated. Accordingly, a defect within the oxide semiconductor film 130 caused by carrier trapping by excess oxygen contained in the oxide semiconductor film 130 can be prevented.

By setting a hydrogen concentration in the channel protection film 150 to be not more than $10^{19}$ atm/cm$^3$, hydrogen diffusion is reduced from an outermost surface of the oxide semiconductor film 130 (one major surface on which the channel protection film 150 is provided) to the channel protection film 150, and excess carrier generation due to hydrogen can be suppressed. Accordingly, resistance of the outermost surface of the oxide semiconductor film 130 can be prevented from being reduced.

A hydrogen concentration in the gate insulating film 120 can be quantified by measuring a profile of a hydrogen concentration in a depth (film thickness) direction using secondary ion mass spectroscopy (SIMS). The hydrogen concentration in the channel protection film 150 can be quantified by measuring a profile of a hydrogen concentration in a depth direction of the channel protection film 150 located between the source electrode 140S and the drain electrode 140D using the secondary ion mass spectroscopy. At this time, it is preferable to measure the profile on a condition of setting a beam spot diameter of the secondary ion mass spectroscopy to the minimum. When a stacked film is used as the gate insulating film 120, a hydrogen concentration of a film closest to the oxide semiconductor film 130 is defined to be not less than $5 \times 10^{20}$ atm/cm$^3$.

Figure 2:
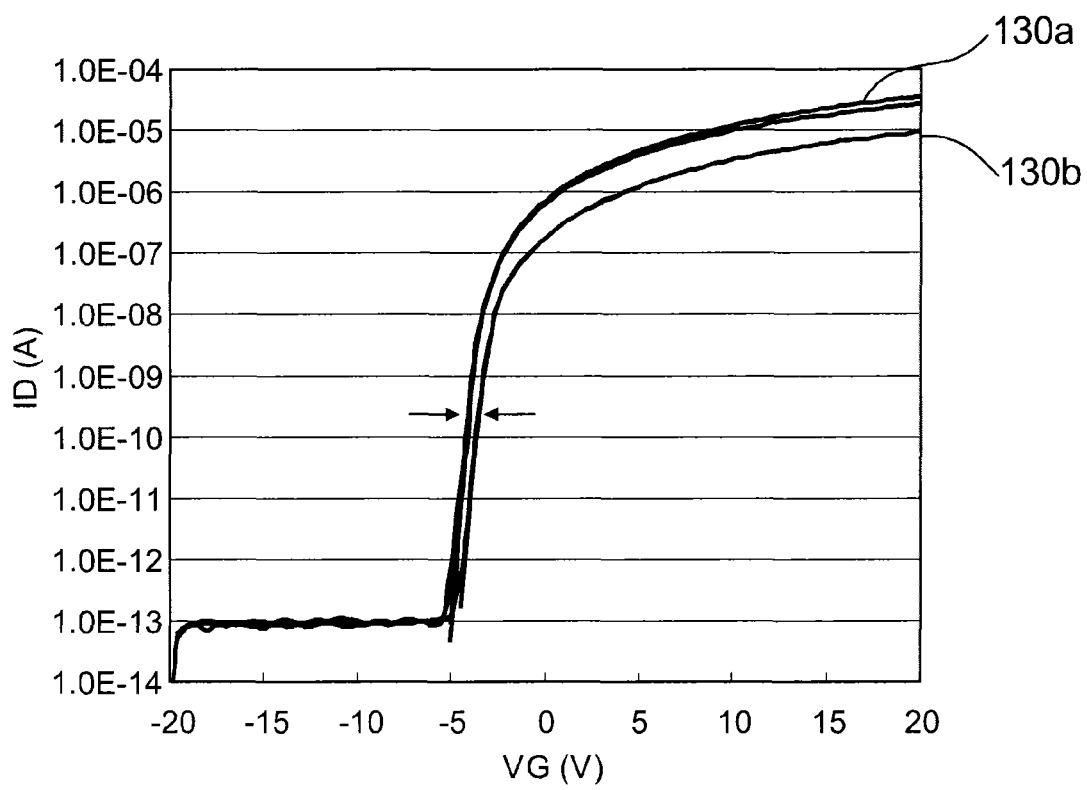
FIG. 2 is a graph showing the current voltage characteristics of the thin film transistor according to the first embodiment.

FIG. 2 is a graph showing current voltage characteristics of the thin film transistor 1. A vertical axis represents a drain current and a horizontal axis represents a gate voltage. A current voltage characteristic is shown as reference character 130a when a width of the oxide semiconductor film 130 in the Y direction in the cross-sectional schematic view of FIG. 1A is short, and a current voltage characteristic is shown as reference character 130b when long.

According to such thin film transistor 1, hysteresis does not occur as shown in FIG. 2. In addition, the characteristic of the thin film transistor 1 remains unchanged depending on a width in a direction perpendicular to a thickness direction. Accordingly, the thin film transistor 1 has high reliability in an initial characteristic.

Meanwhile, when the hydrogen concentration in the gate insulating film 120 is less than $5 \times 10^{20}$ atm/cm$^3$, dangling bond in the interface of the oxide semiconductor film 130 and the gate insulating film 120 and a defect within the oxide semiconductor film 130 are not sufficiently hydrogen-terminated. As a result, hysteresis becomes large in the current voltage characteristic, and thus reliability of the thin film transistor becomes low.

In addition, when the hydrogen concentration in the channel protection film 150 is more than $10^{19}$ atm/cm$^3$, hydrogen diffusion occurs from the outermost surface of the oxide semiconductor film 130 to the channel protection film 150, and thereby a carrier is generated. As a result of this, depletion by the gate voltage cannot be performed sufficiently, and thus the current voltage characteristic of the thin film transistor becomes in a normally on state.

Figure 3:
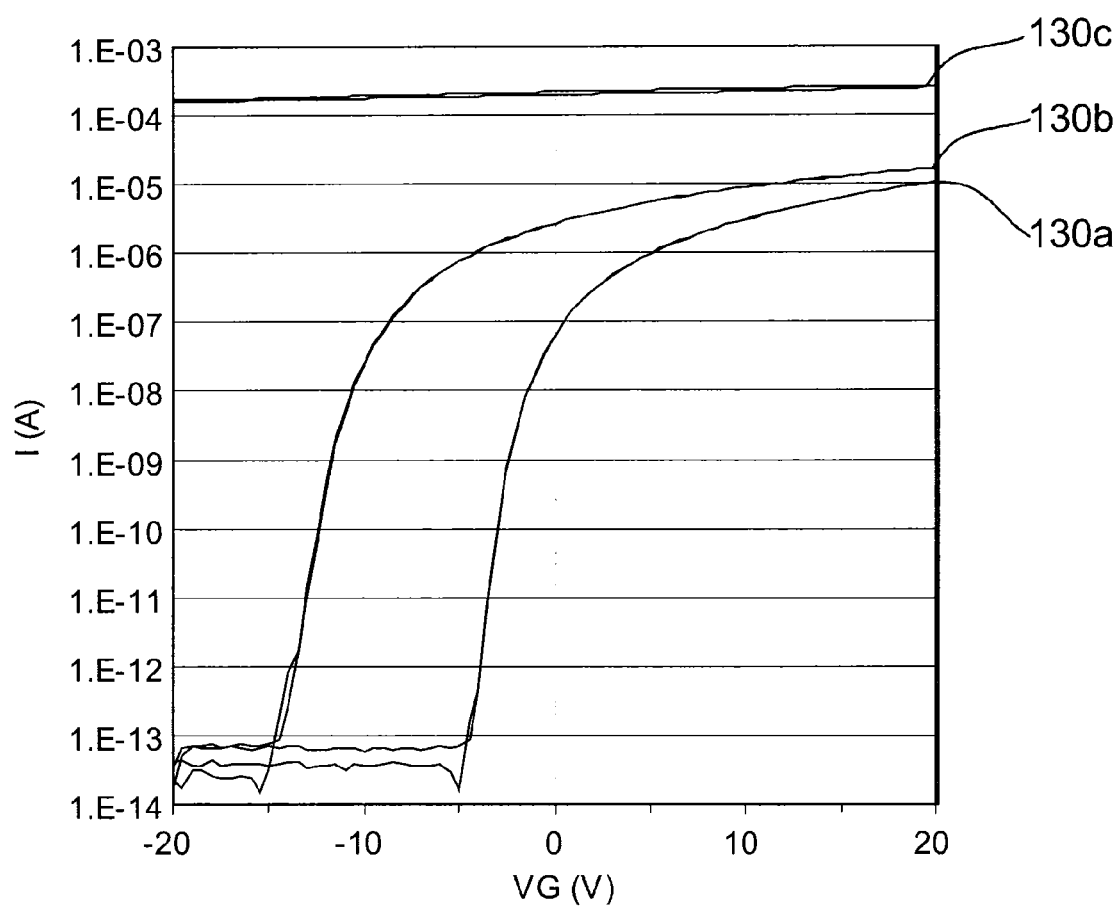
FIG. 3 is a view showing the current voltage characteristics of a thin film transistor according to a comparative example.

FIG. 3 is a comparative graph showing current voltage characteristics of a thin film transistor when a hydrogen concentration in a gate insulating film is less than $5 \times 10^{20}$ atm/cm$^3$, and a hydrogen concentration in a channel protection film is more than $10^{19}$ atm/cm$^3$. A vertical axis represents a drain current and a horizontal axis represents a gate voltage. Each curve shows a current voltage characteristic when the width of the oxide semiconductor film 130 in the Y direction in the cross-sectional schematic view of FIG. 1A is changed, and a curve 130a shows the current voltage characteristic when the width is large, a curve 130c shows when the width is small, and a curve 130b shows when the width is intermediate between the above-described two.

When the hydrogen concentration in the gate insulating film is less than $5 \times 10^{20}$ atm/cm$^3$, and the hydrogen concentration in the channel protection film is more than $10^{19}$ atm/cm$^3$, a defect of the oxide semiconductor film is hydrogen-terminated by hydrogen from the channel protection film, and thus hysteresis does not occur. However, distribution occurs in the hydrogen concentration in the interface between the oxide semiconductor film and the gate insulating film within a film face (XY face) of the oxide semiconductor film, the current voltage characteristics change largely depending on a shape of the oxide semiconductor film.

Accordingly, the concentration of hydrogen contained in the gate insulating film 120 is set to be not less than $5 \times 10^{20}$ atm/cm$^3$, and the concentration of hydrogen contained in the channel protection film 150 is set to be not more than $10^{19}$ atm/cm$^3$, whereby the thin film transistor 1 with high reliability in which hysteresis does not easily occur, and in which the current voltage characteristic does not easily depend on the shape of the oxide semiconductor layer 130 can be obtained.

Hereinafter, a method for manufacturing the thin film transistor 1 of the first embodiment will be described using FIG.

4A to FIG. 4F. FIG. 4A to FIG. 4F are cross-sectional schematic views showing the method for manufacturing the thin film transistor 1 according to the first embodiment. The cross-sectional schematic views of FIG. 4A to FIG. 4F correspond to the cross-sectional schematic view of FIG. 1A, and shows a cross section of an XZ plane.

A glass substrate is used as the substrate 100. In addition, MoW is used as the gate electrode 110. First, a MoW film that serves as the gate electrode 110 is formed on the substrate 100 by a sputtering method so that a thickness thereof may be 200 nm, and it is processed into a predetermined pattern (FIG. 4A). A photolithographic method is used for patterning and, for example, mixed acid of phosphoric acid, acetic acid, nitric acid, and water is used for etching. In a face parallel to the one major surface of the substrate 100, a direction with a longer width along a side of the gate electrode 110 is defined as a longitudinal direction. The longitudinal direction of the gate electrode 110 corresponds to a Y direction in FIG. 4A to FIG. 4F.

Next, the gate insulating film 120 that covers the gate electrode 110 is formed so that a hydrogen concentration is not less than $5 \times 10^{20}$ atm/cm$^3$ (FIG. 4B). Here, the gate insulating film 120 is formed by applying annealing to a film after it is formed using the sputtering method. The hydrogen concentration within the gate insulating film 120 can be set to be not less than $5 \times 10^{20}$ atm/cm$^3$ by adjusting a hydrogen concentration of a foaming gas, an annealing (heat treatment) time, and an annealing temperature. The hydrogen concentration in the foaming gas is preferably set to be not less than 0.5% and not more than 10%. The annealing time is preferably set to be not less than 30 minutes. The annealing temperature is preferably set to be not less than 160° C.

For example, a silicon oxidation film (SiO$_2$) with a thickness of 350 nm is deposited as the gate insulating film 120 by the sputtering method so as to cover the substrate 100 and the gate electrode 110. A gas of 2% hydrogen concentration diluted with nitrogen is used for the foaming gas. Annealing is applied to the gate insulating film 120 at 200° C. after the deposition. Film formation of the gate insulating film 120 can be performed without heating.

Next, an IGZO film is formed on the gate insulating film 120 by a reactive DC sputtering method so that a thickness is 30 nm. Subsequently, the IGZO is processed using oxalic acid of 2% to form the oxide semiconductor film 130 (FIG. 4C). The oxide semiconductor film 130 faces the gate electrode 110 through the gate insulating film 140. For example, in a face parallel to the one major surface of the substrate 100, the oxide semiconductor film 130 can be processed so that the longitudinal direction of the oxide semiconductor film 130 is orthogonal to the longitudinal direction of the lower layer gate electrode 110. Namely, the longitudinal direction of the oxide semiconductor film 130 is the X direction.

Next, a silicon oxidation film with a thickness of 150 nm is deposited on the oxide semiconductor film 130 by the sputtering method. The silicon oxidation film is patterned into a shape to cover the end side along the longitudinal direction of the oxide semiconductor film 130 to form the channel protection film 150 (FIG. 4D). Patterning can be used, for example, by combining mask exposure and back-side exposure that uses the gate electrode 110 as a mask. Etching can be performed, for example, by RIE (Reactive ion Etching) processing that uses a tetrafluoromethane (CF$_4$) gas. At this time, a concentration of hydrogen contained in the channel protection film 150 is set to be not more than $10^{19}$ atm/cm$^3$. Specifically, for example, when the channel protection film 150 is formed by the sputtering method, the hydrogen concentration can be set to be not more than $10^{19}$ atm/cm$^3$ by adjusting a degree of vacuum before film formation. For example, the hydrogen concentration can be set to be not more than $10^{19}$ atm/cm$^3$ by setting the degree of vacuum to be not more than $10^{-4}$ Pa.

Next, the gate insulating film 120 is etched using buffered hydrofluoric acid (BHF) in order to form a contact hole (not shown) for taking out the gate electrode 110.

Next, Ti, Al, and Ti that serve as the source electrode 140S and the drain electrode 140D are stacked on the channel protection film 150, the oxide semiconductor film 130, and the gate insulating film 120 by a DC sputtering method so that thicknesses of Ti, Al, and Ti are 50 nm, 100 nm, and 50 nm in that order. This stacked layer is processed into a predetermined pattern using a mixture of alkali and weak acid and mixed acid to form the source electrode 140S and the drain electrode 140D (FIG. 4E). Namely, the source electrode 140S is formed of a Ti film 141S, an Al film 142S, and a Ti film 143S. The drain electrode 140D is formed of a Ti film 141D, an Al film 142D, and a Ti film 143D. The source electrode 140S and the drain electrode 140D are formed as a pattern to cover the end side along a perpendicular direction (Y direction) to the longitudinal direction of the oxide semiconductor film 130. The source electrode 140S and the drain electrode 140D are connected to the oxide semiconductor film 130.

After that, annealing is performed at not less than 160° C. approximately for an hour in a clean oven in order to eliminate device damage in a process. Annealing at more than 200° C. is more desirable.

Furthermore, a silicon oxidation film is deposited as the sealing layer 160 by a PE-CVD (plasma-enhanced chemical vapor deposition) method (FIG. 4F). For example, a substrate temperature at the time of film formation is set to be 200° C., and a thickness of the sealing layer 160 is set to be 150 to 300 nm. As a gas for film formation, for example, silane (SiH$_4$), nitric oxide (N$_2$O), and argon (Ar) can be used. After that, a contact hole 170 for taking out the drain electrode 140D is formed in the sealing layer 160 using buffered hydrofluoric acid.

Figure 5A:
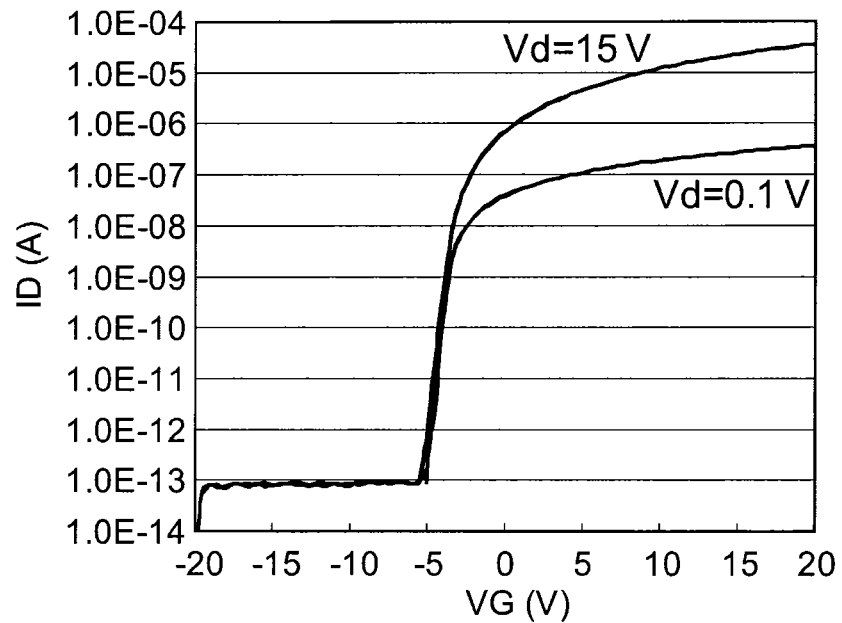
FIG. 5A and FIG. 5B are a view showing the current voltage characteristics according to the first embodiment and a comparative view.
Figure 5B:
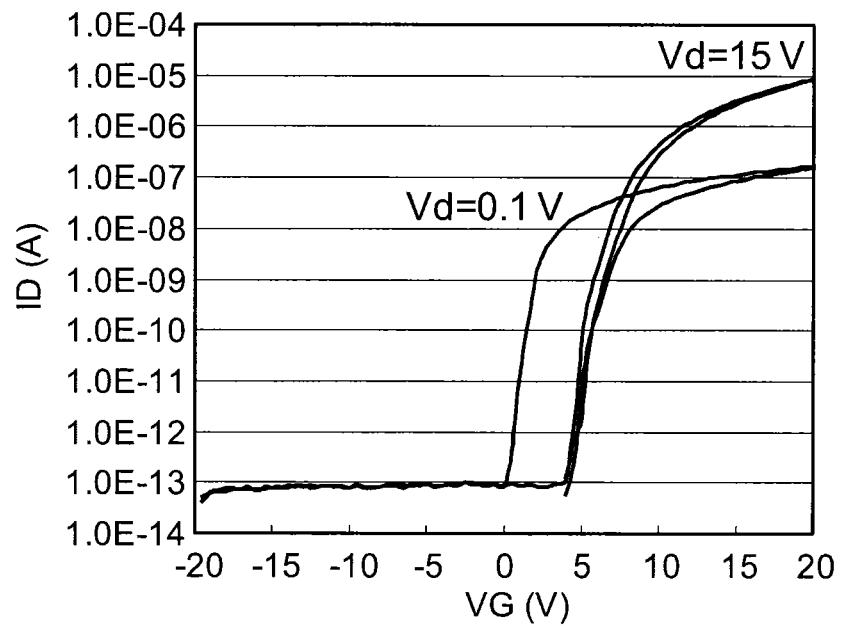

FIG. 5A is a graph showing a current voltage characteristic of the thin film transistor 1 to which annealing is performed before forming the gate insulating film 120, and FIG. 5B is a comparative graph showing a current voltage characteristic of the thin film transistor 1 to which annealing is not performed before forming the gate insulating film 120. A drain current is shown in a vertical axis and a gate voltage is shown in a horizontal axis. Respective graphs show current voltage characteristics when a drain voltage is set to be 0.1 V and is set to be 15 V. Hysteresis occurs in the thin film transistor to which annealing is not performed. Meanwhile, hysteresis is reduced in the thin film transistor 1 to which annealing is performed as compared with the thin film transistor to which annealing was not performed, and it turns out that an electric characteristic with high reliability can be obtained.

As described above, according to the first embodiment, the thin film transistor with high reliability can be obtained.

Second Embodiment

Hereinafter, a method for manufacturing a thin film transistor 2 according to a second embodiment will be described. FIG. 6A to FIG. 6F are cross-sectional schematic views showing the method for manufacturing the thin film transistor 2 according to the second embodiment. In the second embodiment, a point is different from the first embodiment where a mixed gas of hydrogen, argon, and oxygen is used when the gate insulating film 120 is formed. Since a configuration of the thin film transistor 2 is the same as in the first embodiment, the same symbols are given to the same portions.

A glass substrate is used as the substrate 100. In addition, MoW is used as the gate electrode 110. First, a MoW film that serves as the gate electrode 110 is formed on the substrate 100 by the sputtering method so that a thickness thereof is 200 nm, and it is processed into a predetermined pattern (FIG. 6A). For example, a photolithographic method is used for patterning, and for example, mixed acid of phosphoric acid, acetic acid, nitric acid, and water can be used for etching.

Next, a silicon oxidation film with a thickness of 350 nm is deposited as the gate insulating film 120 by the sputtering method so as to cover the substrate 100 and the gate electrode 110 (FIG. 6B). Film formation of the gate insulating film 120 is performed, for example, without heating. When the gate insulating film 120 is formed, a mixed gas containing hydrogen, ($H_2$) and argon (Ar) and oxygen ($O_2$) is used.

The hydrogen concentration within the gate insulating film 120 can be set to be not less than $5\times10^{20}$ atm/cm$^3$ by adjusting a hydrogen concentration of the mixed gas. The hydrogen concentration in the mixed gas is preferably set to be not less than 0.5% and not more than 10%. For example, a gas of 2% hydrogen concentration diluted with nitrogen can be used for the mixed gas. Annealing is applied, for example, at not less than 160° C. after film formation. Annealing at more than 200° C. is more desirable.

Subsequent processes are similar to the processes in the first embodiment. Namely, an IGZO film is formed on the gate insulating film 120 by the reactive DC sputtering method so that a thickness thereof is 30 nm. Subsequently, the IGZO is processed using oxalic acid of 2% to form the oxide semiconductor film 130 (FIG. 6C). The oxide semiconductor film 130 faces the gate electrode 110 through the gate insulating film 140.

Next, a silicon oxidation film is deposited on the oxide semiconductor film 130 by the sputtering method so that a thickness thereof is 150 nm. The silicon oxidation film is patterned into a shape to cover the end side along the longitudinal direction of the oxide semiconductor film 130 to form the channel protection film 150 (FIG. 6D). Patterning can be used, for example, by combining mask exposure and backside exposure that uses the gate electrode 110 as a mask. Etching can be performed, for example, by RIE (Reactive ion Etching) processing that uses the tetrafluoromethane ($CF_4$) gas. At this time, a concentration of hydrogen contained in the channel protection film 150 is set to be not more than $10^{19}$ atm/cm$^3$. Specifically, for example, when the channel protection film 150 is formed by the sputtering method, the hydrogen concentration can be set to be not more than $10^{19}$ atm/cm$^3$ by adjusting the degree of vacuum before film formation. For example, the hydrogen concentration can be set to be not more than $10^{19}$ atm/cm$^3$ by setting the degree of vacuum to be not more than $10^{-4}$ Pa.

Next, the gate insulating film 120 is etched using buffered hydrofluoric acid (BHF) in order to form a contact hole (not shown) for taking out the gate electrode 110.

Next, Ti, Al, and Ti that serve as the source electrode 140S and the drain electrode 140D are stacked on the channel protection film 150, the oxide semiconductor film 130, and the gate insulating film 120 by the DC sputtering method so that thicknesses of Ti, Al, and Ti are 50 nm, 100 nm, and 50 nm in that order. This stacked layer is processed into a predetermined pattern using a mixture of alkali and weak acid and mixed acid to form the source electrode 140S and the drain electrode 140D (FIG. 6E). The source electrode 140S and the drain electrode 140D are connected to the oxide semiconductor film 130.

After that, annealing is performed at not less than 160° C. approximately for an hour in a clean oven in order to eliminate device damage in the process. Annealing at more than 200° C. is more desirable.

Furthermore, a silicon oxidation film is deposited as the sealing layer 160 by the PE-CVD (plasma-enhanced chemical vapor deposition) method (FIG. 6F). After that, the contact hole 170 for taking out the drain electrode 140D is formed in the sealing layer 160 using buffered hydrofluoric acid.

Also in the second embodiment, similarly to the first embodiment, a concentration of hydrogen contained in the gate insulating film 120 of the thin film transistor 2 can be set to be not less than $5\times10^{20}$ atm/cm$^3$, and a concentration of hydrogen contained in the channel protection film 150 can be set to be not more than $10^{19}$ atm/cm$^3$. Accordingly, as described above, according to the second embodiment, the thin film transistor 2 with high reliability can be obtained.

Third Embodiment

Hereinafter, a method for manufacturing a thin film transistor 3 according to a third embodiment will be described. FIG. 7A to FIG. 7F are cross-sectional schematic views showing the method for manufacturing the thin film transistor 3 according to the third embodiment. In the third embodiment, a point is different from the first embodiment where the gate insulating film 120 is formed with a CVD method, and a mixed gas of silane ($SiH_4$), nitric oxide ($N_2O$), and argon (Ar) is used. Since a configuration of the thin film transistor 3 is the same as in the first embodiment, the same symbols are given to the same portions.

A glass substrate is used as the substrate 100. In addition, MoW is used as the gate electrode 110. First, a MoW film that serves as the gate electrode 110 is formed on the substrate 100 by sputtering so that a thickness thereof is 200 nm, and it is processed into a predetermined pattern (FIG. 7A). The photolithographic method is used for patterning, and for example, mixed acid of phosphoric acid, acetic acid, nitric acid, and water is used for etching.

Next, a silicon oxidation film with a thickness of 350 nm is deposited as the gate insulating film 120 by the CVD method so as to cover the substrate 100 and the gate electrode 110 (FIG. 7B). A film formation temperature is set to be 200° C. When the gate insulating film is formed, a mixed gas containing silane ($SiH_4$), nitric oxide ($N_2O$), and argon (Ar) is used. Specifically, a hydrogen concentration within the gate insulating film 120 can be set to be not less than $5\times10^{20}$ atm/cm$^3$ by adjusting a silane concentration of the mixed gas. A silane concentration in the mixed gas is preferably set to be not less than 0.5% and not more than 10%. For example, the silane concentration in the mixed gas can be set to be approximately 2%. In addition, film formation power when PE-CVD is performed is, for example, set to be 300 W.

Subsequent processes are similar to the processes in the first embodiment. Namely, an IGZO film is formed on the gate insulating film 120 by the reactive DC sputtering method so that a thickness thereof is 30 nm. Subsequently, the IGZO is processed using oxalic acid of 2% to form the oxide semiconductor film 130 (FIG. 7C). The oxide semiconductor film 130 faces the gate electrode 110 through the gate insulating film 140.

Next, a silicon oxidation film is deposited on the oxide semiconductor film 130 by the sputtering method so that a thickness thereof is 150 nm. The silicon oxidation film is patterned into a shape to cover the end side along the longitudinal direction of the oxide semiconductor film 130 to form the channel protection film 150 (FIG. 7D). Patterning can be used, for example, by combining mask exposure and backside exposure that uses the gate electrode 110 as a mask. Etching can be performed, for example, by RIE (Reactive ion Etching) processing that uses the tetrafluoromethane ($CF_4$) gas. At this time, a concentration of hydrogen contained in the channel protection film 150 is set to be not more than $10^{19}$ atm/$cm^3$. Specifically, for example, when the channel protection film 150 is formed by the sputtering method, the hydrogen concentration can be set to be not more than $10^{19}$ atm/$cm^3$ by adjusting a degree of vacuum before film formation. For example, the hydrogen concentration can be set to be not more than $10^{19}$ atm/$cm^3$ by setting the degree of vacuum to be not more than $10^{-4}$ Pa.

Next, the gate insulating film 120 is etched using buffered hydrofluoric acid (BHF) in order to form a contact hole (not shown) for taking out the gate electrode 110.

Next, Ti, Al, and Ti that serve as the source electrode 140S and the drain electrode 140D are stacked on the channel protection film 150, the oxide semiconductor film 130, and the gate insulating film 120 by the DC sputtering method so that thicknesses of Ti, Al, and Ti are 50 nm, 100 nm, and 50 nm in that order. This stacked layer is processed into a predetermined pattern using a mixture of alkali and weak acid and mixed acid to form the source electrode 140S and the drain electrode 140D (FIG. 7E). The source electrode 140S and the drain electrode 140D are connected to the oxide semiconductor film 130.

After that, annealing is performed at not less than 160° C. approximately for an hour in a clean oven in order to eliminate device damage in the process. Annealing at more than 200° C. is more desirable.

Furthermore, a silicon oxidation film is deposited as the sealing layer 160 by the PE-CVD (plasma-enhanced chemical vapor deposition) method (FIG. 7F). After that, the contact hole 170 for taking out the drain electrode 140D is formed in the sealing layer 160 using buffered hydrofluoric acid.

Also in the third embodiment, similarly to the first embodiment, a concentration of hydrogen contained in the gate insulating film 120 of the thin film transistor 3 can be set to be not less than $5 \times 10^{20}$ atm/$cm^3$, and a concentration of hydrogen contained in the channel protection film 150 can be set to be not more than $10^{19}$ atm/$cm^3$.

Accordingly, as described above, according to the second embodiment, the thin film transistor 3 with high reliability using the oxide semiconductor can be obtained.

Fourth Embodiment

Figure 8:
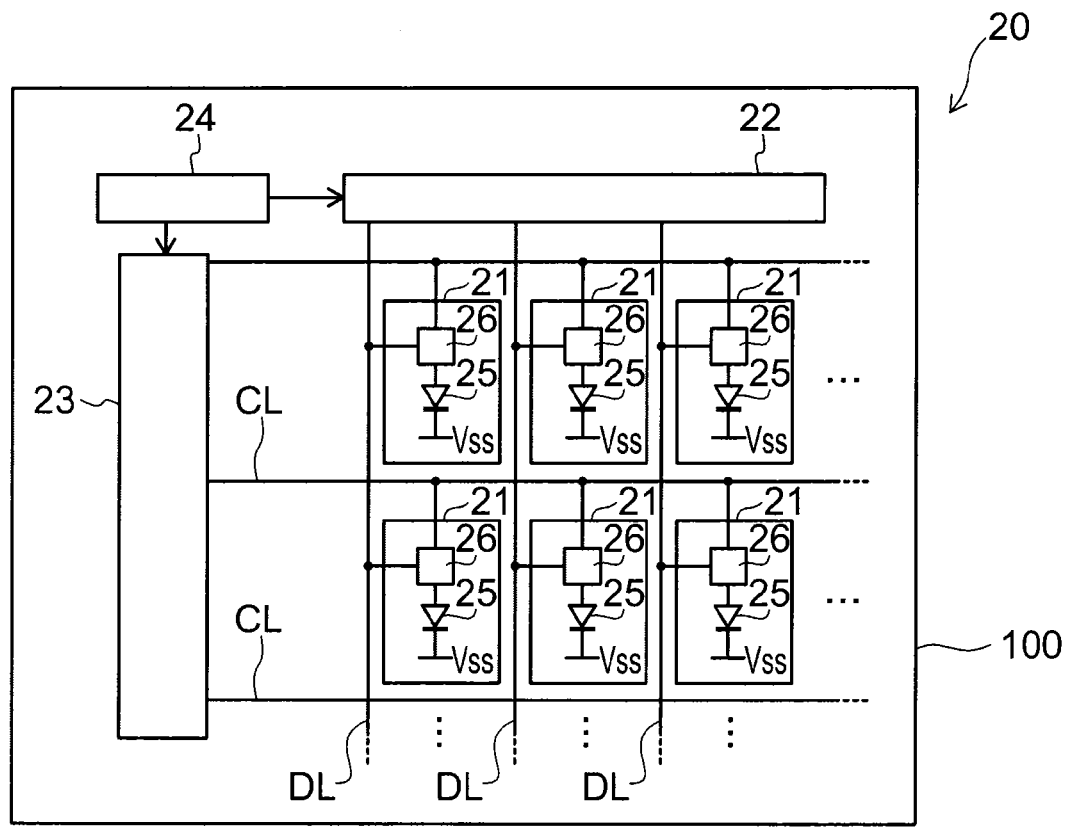
FIG. 8 is a plan view showing a display device according to a fourth embodiment.

FIG. 8 is a plan view showing a display device according to a fourth embodiment.

A display device 20 includes a circuit in which a control line CL extending in one direction parallel to the one major surface of the substrate 100, and a digit line DL parallel to the one major surface of the substrate 100 and extending in another direction perpendicular to the control line CL are disposed in a matrix form. The circuit includes a plurality of pixels 21 disposed in a matrix form. A thin film transistor 26 connected to a display device 25 is included in the pixel 21. One terminal of the thin film transistor 26 is connected to the control line CL, and the other terminal thereof is connected to the digit line DL. The digit line DL is connected to a digit line driver 22. In addition, the control line CL is connected to a control line driver 23. The digit line driver 22 and the control line driver 23 are controlled by a controller 24.

A liquid crystal layer and an organic electroluminescence layer can be used for the display device 25. The organic electroluminescence layer is used here. The thin film transistor 1 of the first embodiment, the thin film transistor 2 of the second embodiment, and the thin film transistor 3 of the third embodiment can be used for the thin film transistor 26.

Figure 9:
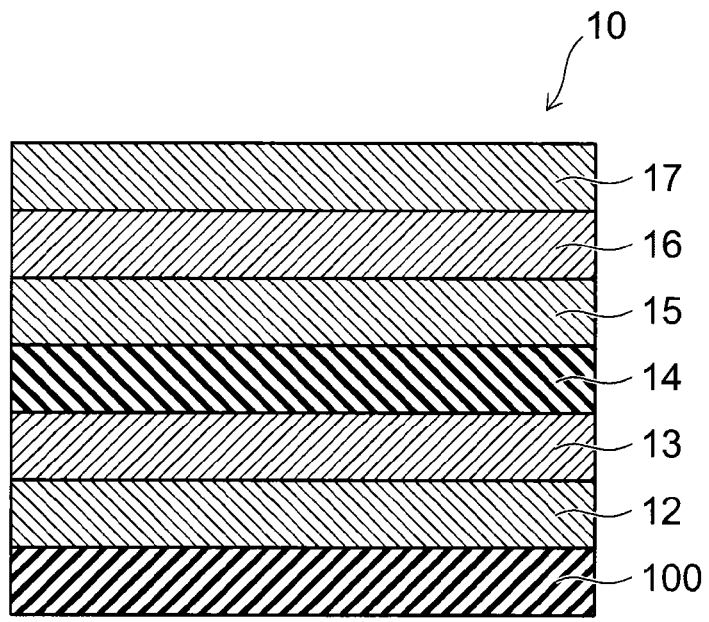
FIG. 9 is a cross-sectional view showing an organic electroluminescent layer according to the fourth embodiment.

FIG. 9 is a cross-sectional view showing an organic electroluminescence layer 10. A circuit is omitted in FIG. 9. The organic electroluminescence layer 10 has a structure in which an anode 12 (first electrode), a hole transport layer 13, a light emitting layer 14, an electron transport layer 15, an electron injection layer 16, and a cathode 17 (second electrode) are sequentially formed on the substrate 100. The hole transport layer 13, the electron transport layer 15, and the electron injection layer 16 are formed if needed. The anode 12 provided on the substrate 11 is connected to the source electrode 140S or the drain electrode 140D of the thin film transistor.

The light emitting layer 14 is formed by dispersing light emitting dopants into a host material. The light emitting layer 14 is a layer having a function that receives holes from the anode and electrons from the cathode, provides a place for recombination of the holes and the electrons, and that thereby emits light. The host material in the light emitting layer is excited by energy generated by this combination. The light emitting dopant becomes in an excited state by energy movement from the host material in the excited state to the light emitting dopant, and light is emitted when the light emitting dopant returns to a ground state again. An image is displayed on the display device 20 by controlling light emission of the organic electroluminescence layer 10 for every pixel 21.

The above-described thin film transistors can be manufactured at a low temperature and have high reliability. A flexible display device with a high display quality can be obtained by forming the thin film transistor 26 on the flexible substrate 100.

Hereinabove, exemplary embodiments of the invention are described with reference to specific examples. However, the embodiments of the invention are not limited to these specific examples. The specific configurations of the components can be suitably selected from publicly known arts by those skilled in the art, and such configurations are encompassed within the scope of the invention as long as they can also implement the invention and achieve similar effects.

Further, any two or more components of the specific examples may be combined within the extent of technical feasibility and are included in the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A display device comprising:
a thin film transistor including:
a substrate;
a gate electrode provided on a part of the substrate;
a first insulating film covering the gate electrode;

an oxide semiconductor film provided on the gate electrode via the first insulating film;

a second insulating film provided on a part of the oxide semiconductor film; and a source electrode and a drain electrode, the source electrode being connected to a first portion of the oxide semiconductor film, the first portion being not covered with the second insulating film, the drain electrode being connected to a second portion of the oxide semiconductor film, the second portion being not covered with the second insulating film, the oxide semiconductor film including an oxide semiconductor including at least one element of In, Ga, and Zn, and a concentration of hydrogen contained in the first insulating film being not less than $5 \times 10^{20}$ atm/cm$^3$, and a concentration of hydrogen contained in the second insulating film being not more than $10^{19}$ atm/cm$^3$ so that a current voltage characteristic of the thin film transistor remains substantially unchanged depending on a width of the oxide semiconductor film parallel to an upper surface of the substrate;

a first electrode connected to the source electrode or the drain electrode of the thin film transistor;

a second electrode facing the first electrode; and a display layer provided between the first electrode and the second electrode.

2. The device according to claim 1, wherein the display layer is an organic electroluminescence layer.

3. The device according to claim 1, wherein the substrate is light-transmissive.

4. The device according to claim 1, wherein the substrate is a glass substrate or a plastic substrate.

5. The device according to claim 1, wherein the substrate is a silicon substrate or a stainless steel substrate.

6. The device according to claim 1, wherein the substrate is flexible.

7. A method for manufacturing a thin film transistor, comprising:

forming a gate electrode on a part of a substrate;

forming a first insulating film covering the gate electrode and containing a concentration of hydrogen not less than $5 \times 10^{20}$ atm/cm$^3$;

forming an oxide semiconductor film on the first insulating film by using an oxide semiconductor including at least one element of In, Ga, and Zn so as to face the gate electrode;

forming a second insulating film on a part of the oxide semiconductor film, the second insulating film containing a concentration of hydrogen not more than $10^{19}$ atm/cm$^3$ so that a current voltage characteristic of the thin film transistor remains substantially unchanged depending on a width of the oxide semiconductor film parallel to an upper surface of the substrate; and forming a source electrode and a drain electrode, the source electrode being connected to a first portion of the oxide semiconductor film, the first portion being not covered with the second insulating film, the drain electrode being connected to a second portion of the oxide semiconductor film, the second portion being not covered with the second insulating film.

8. The method according to claim 7, wherein the forming the first insulating film is performed by using a sputtering method and by annealing at not less than 160° C. after forming the first insulating film.

9. The method according to claim 7, wherein the forming the first insulating film is performed by a sputtering method using a foaming gas containing hydrogen not less than 0.5% and not more than 10%.

10. The method according to claim 9, wherein the foaming gas is a foaming gas containing nitrogen and hydrogen, or a foaming gas containing argon, oxygen, and hydrogen.

11. The method according to claim 7, wherein the forming the first insulating film is performed by being subjected to annealing treatment for not less than 30 minutes after film formation using a sputtering method.

12. The method according to claim 7, wherein the forming the first insulating film is performed by using a CVD method using a mixed gas containing nitric oxide, argon, and silane, a concentration of silane being not less than 0.5% and not more than 10%.

13. The method according to claim 7, wherein the forming the second insulating film is performed by using a sputtering method by setting a degree of vacuum to be not more than $10^{-4}$ Pa.

* * * * *